(12) United States Patent
Lai

(10) Patent No.: US 6,858,495 B2
(45) Date of Patent: Feb. 22, 2005

(54) MULTI-BIT MEMORY UNIT AND FABRICATION METHOD THEREOF

(75) Inventor: Erh-Kun Lai, Taichung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/357,427

(22) Filed: Feb. 4, 2003

(65) Prior Publication Data

US 2003/0235967 A1 Dec. 25, 2003

(30) Foreign Application Priority Data

Jun. 24, 2002 (TW) .......................... 91113773 A

(51) Int. Cl.⁷ ............................................ H01L 21/336
(52) U.S. Cl. ....................... 438/259; 438/261; 438/270; 438/272
(58) Field of Search ................................ 438/259, 261, 438/270, 272; 257/324, 330, 332

(56) References Cited

U.S. PATENT DOCUMENTS 5,616,510 A * 4/1997 Wong .......................... 438/259
6,043,122 A * 3/2000 Liu et al. ..................... 438/257

* cited by examiner

*Primary Examiner*—Michael Trinh
*Assistant Examiner*—Christy Novacek
(74) *Attorney, Agent, or Firm*—Birch, Stewart, Kolasch & Birch, LLP

(57) ABSTRACT

A multi-bit memory unit and fabrication method thereof. A semiconductor substrate forming a protruding semiconductor substrate is provided, an ion implantation region is formed on the semiconductor substrate beside the protruding semiconductor substrate, a spacer is formed on a sidewall of the protruding semiconductor substrate, a doped region is formed on the semiconductor substrate, and an ONO layer is conformally formed on the surface of the protruding semiconductor substrate, the spacer, the doped region, and the semiconductor substrate.

21 Claims, 9 Drawing Sheets

MULTI-BIT MEMORY UNIT AND FABRICATION METHOD THEREOF

BACKGROUND OF THE INVENTION

1. Field of the Invention

The invention relates to a structure of memory unit and, more particularly, to a memory with multi-bits and fabrication method thereof.

2. Description of the Related Art

Memory devices for nonvolatile storage of information are currently in widespread use, in a myriad of applications. A few examples of nonvolatile semiconductor memory include read only memory (ROM), programmable read only memory (PROM), erasable programmable read only memory (EPROM), electrically erasable programmable read only memory (EEPROM) and flash EEPROM.

In many circuit designs it is desirable to have a nonvolatile memory device that can be erased and reprogrammed in-circuit without the need to remove the device.

High-density nonvolatile memory devices have been receiving much attention for application in many fields. One of the most important factors is the low cost of the reduced size of each memory cell.

Only one set of data is programmed to or erased from the flash memory at a time.

In FIG. 1a, high voltage is applied to a control gate 105, and electrons enter a floating gate 103 from a source 101a in the silicon substrate 101 through the gate oxide layer 102. Thus, the flash memory is programmed.

In FIG. 1b, low voltage or no voltage is applied to the control gate 105 and high voltage is applied to the drain 101b in the silicon substrate 101, thus electrons return to the source 101a from the floating gate 103 through the gate oxide layer 102. Thus, the flash memory is erased.

Eitan discloses a two-bits non-volatile electrically erasable and programmable semiconductor memory cell in U.S. Pat. No. 6,011,725, in which two sets of data are stored in the non-volatile electrically erasable and programmable semiconductor memory cell.

SUMMARY OF THE INVENTION

The present invention is directed to a multi-bit memory unit and fabrication method thereof to increase the storage capacity thereof.

Accordingly, the present invention provides a method for fabricating a multi-bit memory unit, in which, first, a semiconductor substrate forming a hard mask layer is provided. Ions are implanted into the semiconductor substrate to form an ion implantation region using the hard mask layer as a mask. A first spacer is formed on a sidewall of the hard mask layer. The semiconductor substrate is anisotropically etched to form a protruding semiconductor substrate using the hard mask layer and the first spacer as masks. A second spacer is formed on a sidewall of the protruding semiconductor substrate and the first spacer. The semiconductor substrate is anisotropically etched to form an opening using the hard mask layer and the second spacer as masks, and then the second spacer is removed. A doped layer is conformally formed on the semiconductor substrate. The doped layer is anisotropically etched to form a third spacer on a sidewall of the protruding semiconductor substrate. The opening is filled with the doped layer. After the hard mask layer and the first spacer are removed, an ONO layer is conformally formed on the semiconductor substrate.

Accordingly, the present invention provides a method for fabricating a multi-bit memory unit, in which, first, a semiconductor substrate forming a hard mask layer is provided. Ions are implanted into the semiconductor substrate to form an ion implantation region using the hard mask layer as a mask. A first insulation layer is conformally formed on the surface of the semiconductor substrate and the hard mask layer. The first insulation is anisotropically etched to form a first spacer on a sidewall of the hard mask layer. The semiconductor substrate is anisotropically etched to form a protruding semiconductor substrate using the hard mask layer and the first spacer as masks. A second insulation layer is conformally formed on a surface of the semiconductor substrate forming the hard mask layer, the first spacer, and the protruding semiconductor substrate. The second insulation layer is anisotropically etched to form a second spacer on a sidewall of the protruding semiconductor substrate and the first spacer. The semiconductor substrate is anisotropically etched to form an opening on the semiconductor substrate using the hard mask layer and the second spacer as masks, and then the second spacer is removed. A doped layer is conformally formed on the semiconductor substrate. The doped layer is anisotropically etched to form a third spacer on a sidewall of the protruding semiconductor substrate. The opening is filled with the doped layer. After the hard mask layer and the first spacer are removed, an ONO layer is conformally formed on the semiconductor substrate.

Accordingly, the present invention provides a multi-bit memory unit comprising a semiconductor substrate, a protruding semiconductor substrate formed on the semiconductor substrate, an ion implantation region formed on a top corner of the protruding semiconductor substrate, a spacer formed on a sidewall of the protruding semiconductor substrate, a doped region formed on the semiconductor substrate beside the spacer, and an ONO layer conformally formed on the surface of the semiconductor substrate forming the protruding semiconductor substrate, the spacer, and the doped region.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
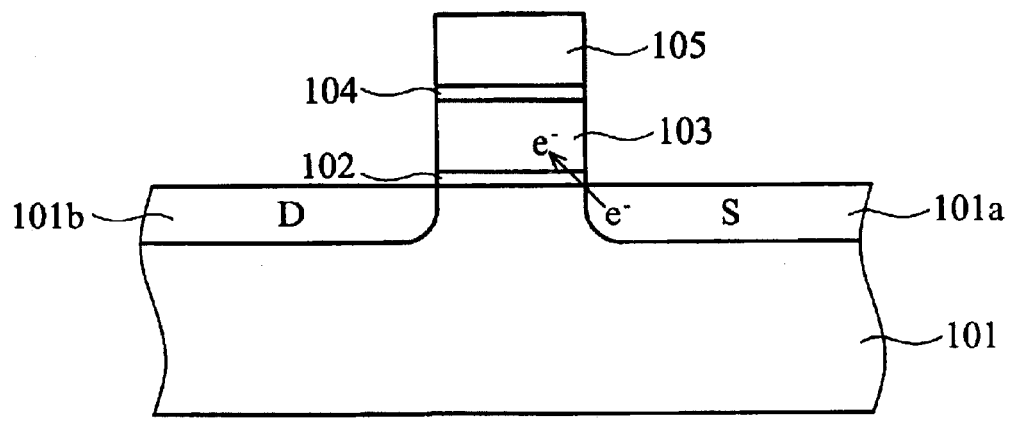
FIG. 1a is a cross-section of the conventional method of programming a flash memory.
Figure 1B:
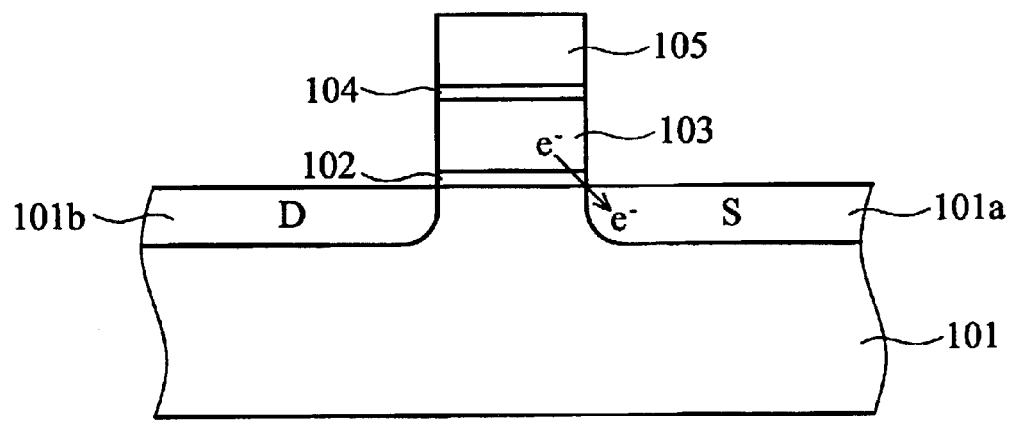
FIG. 1b is a cross-section of the conventional method of erasing a flash memory.
Figure 2A:
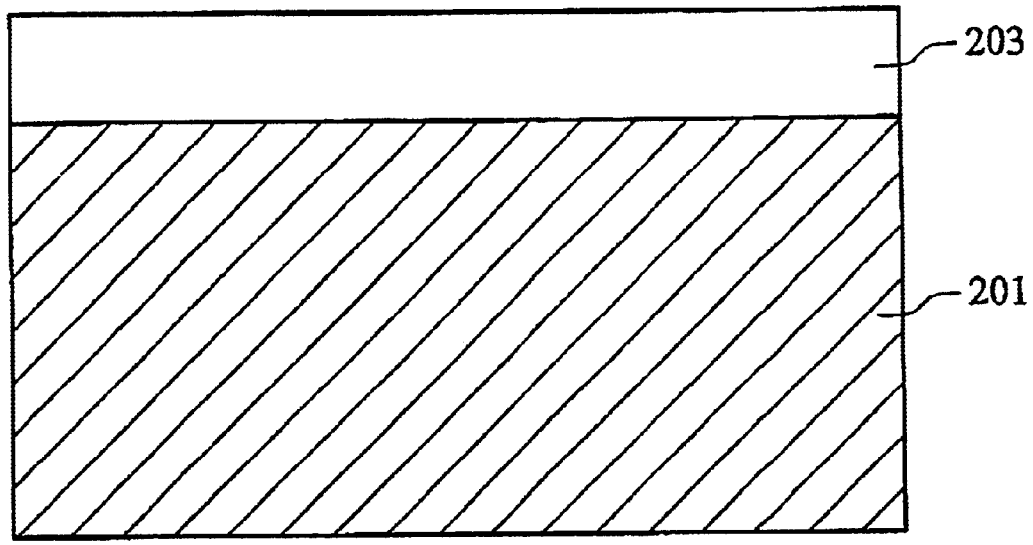
FIGS. 2a–2n are cross-sections of the multi-bit memory unit of the present invention.
Figure 2B:
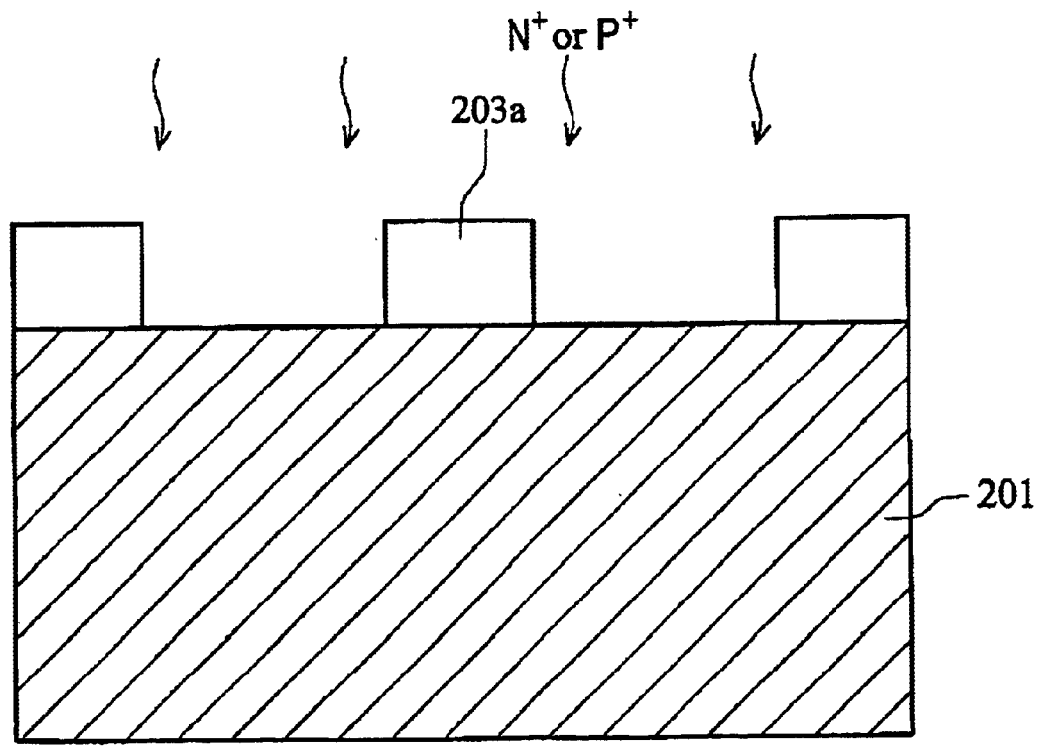
Figure 2C:
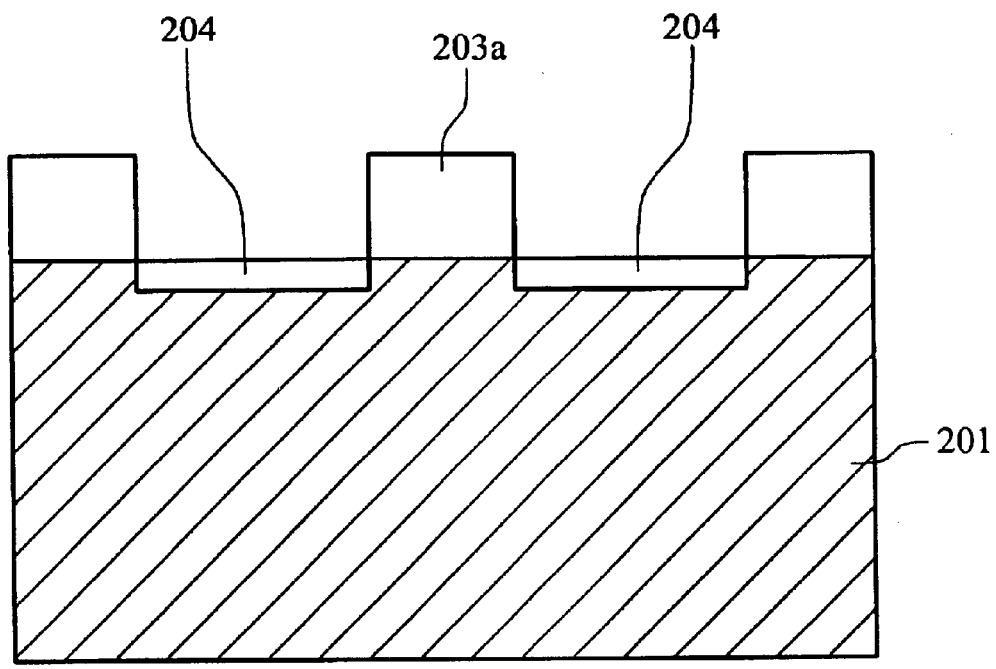
Figure 2D:
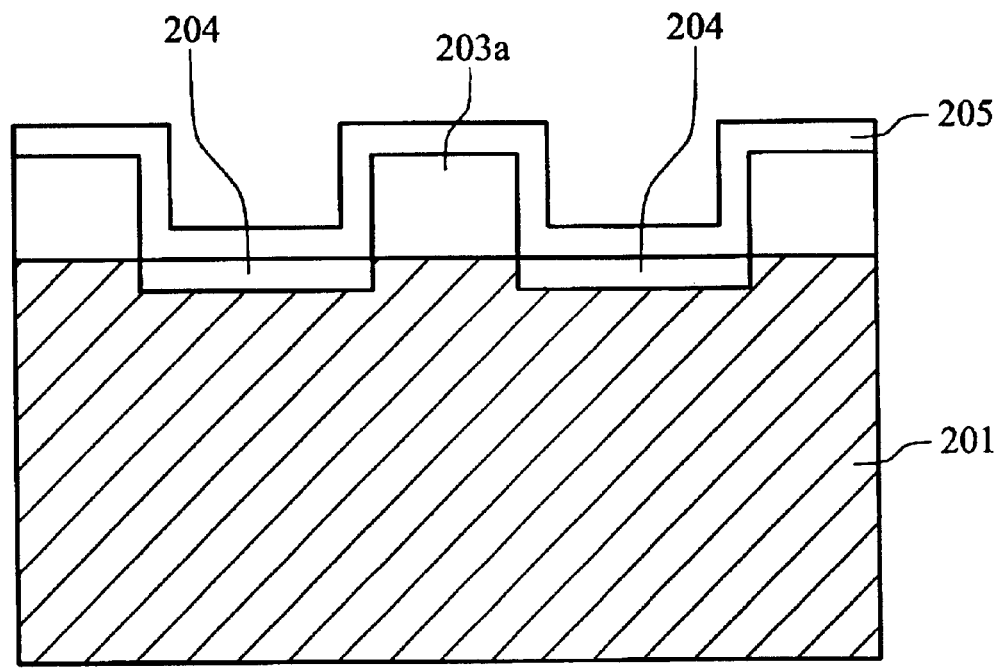
Figure 2E:
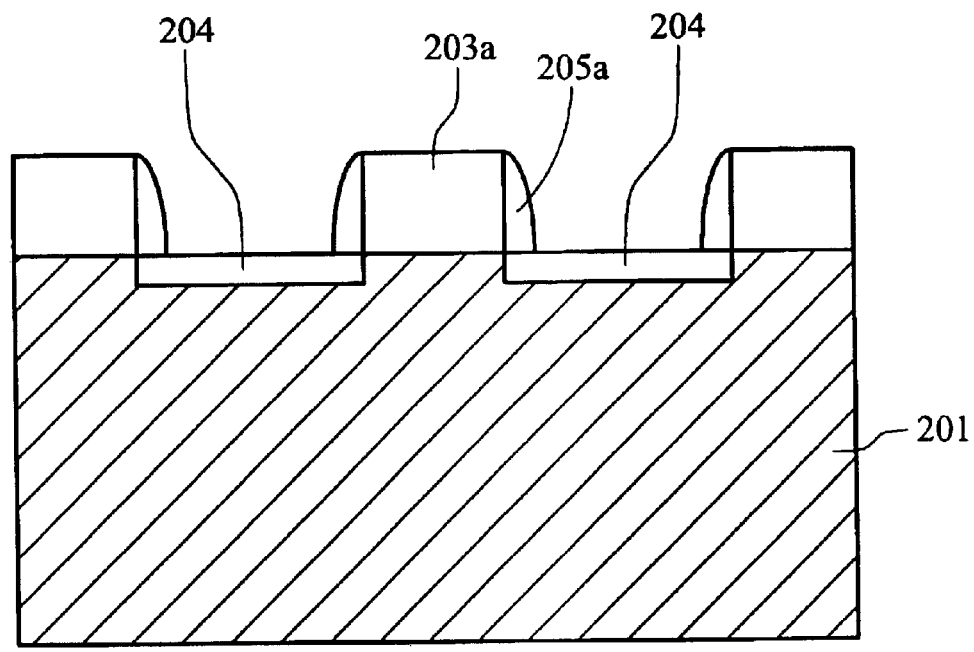
Figure 2F:
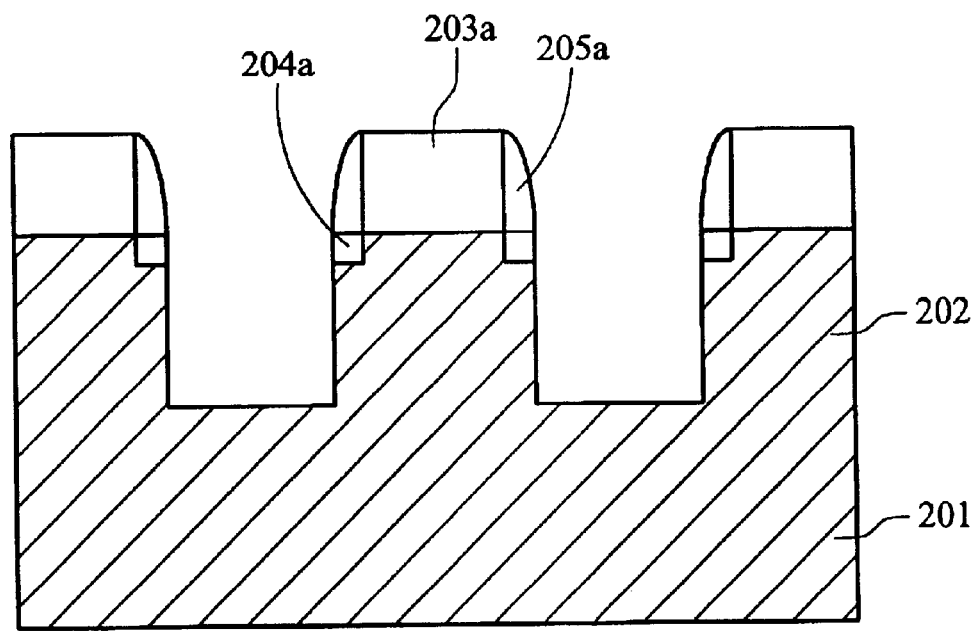
Figure 2G:
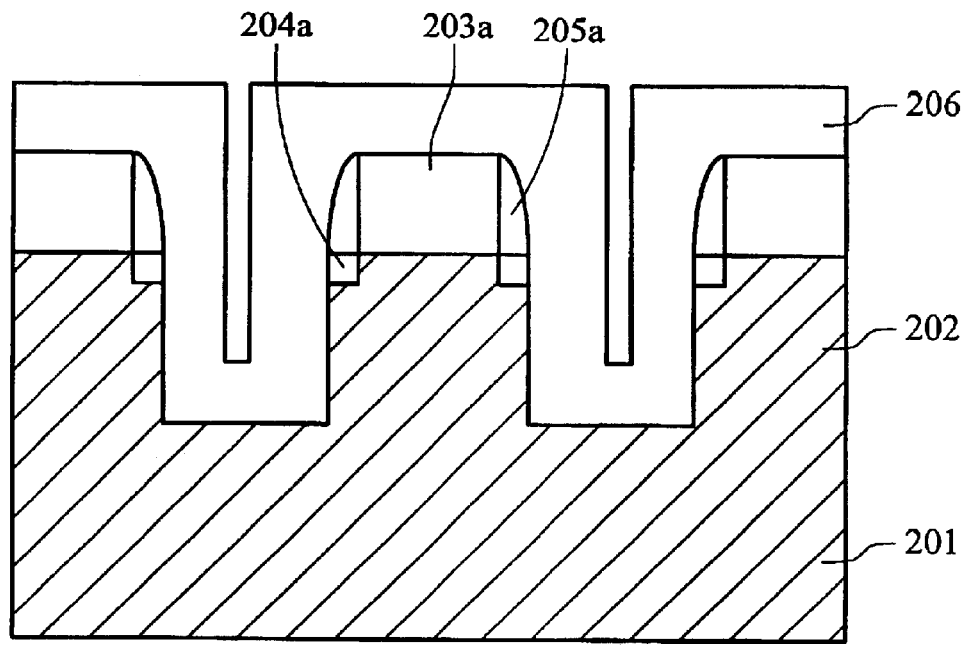
Figure 2H:
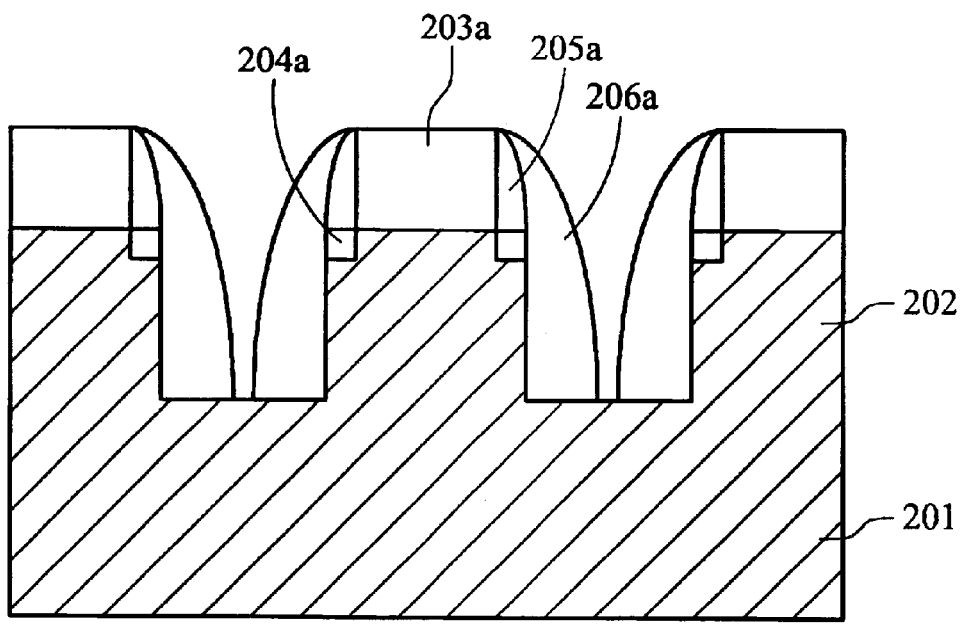
Figure 2I:
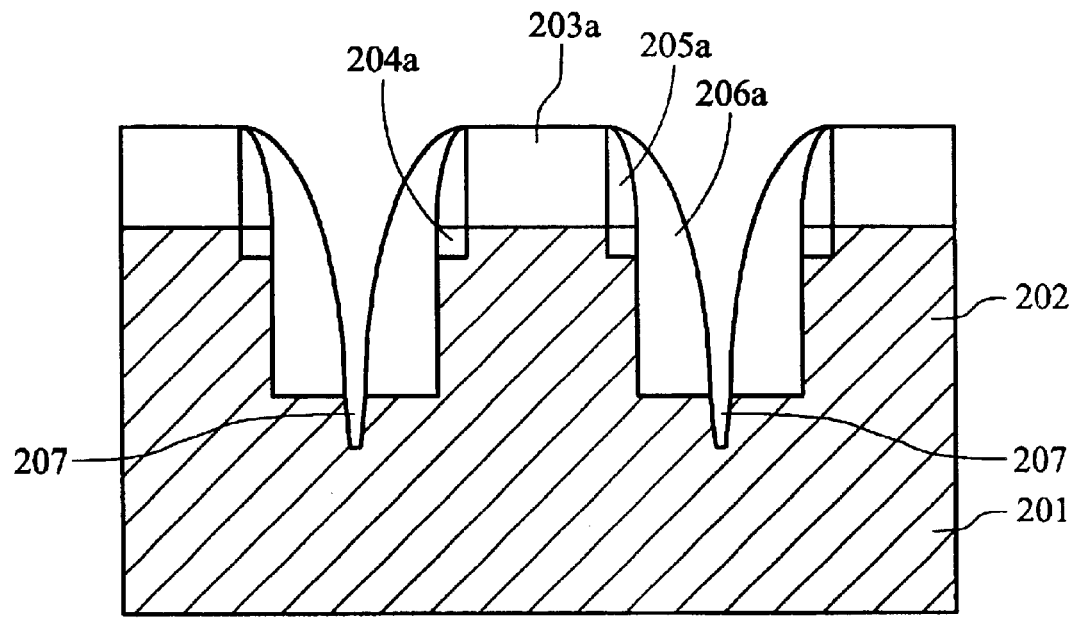
Figure 2J:
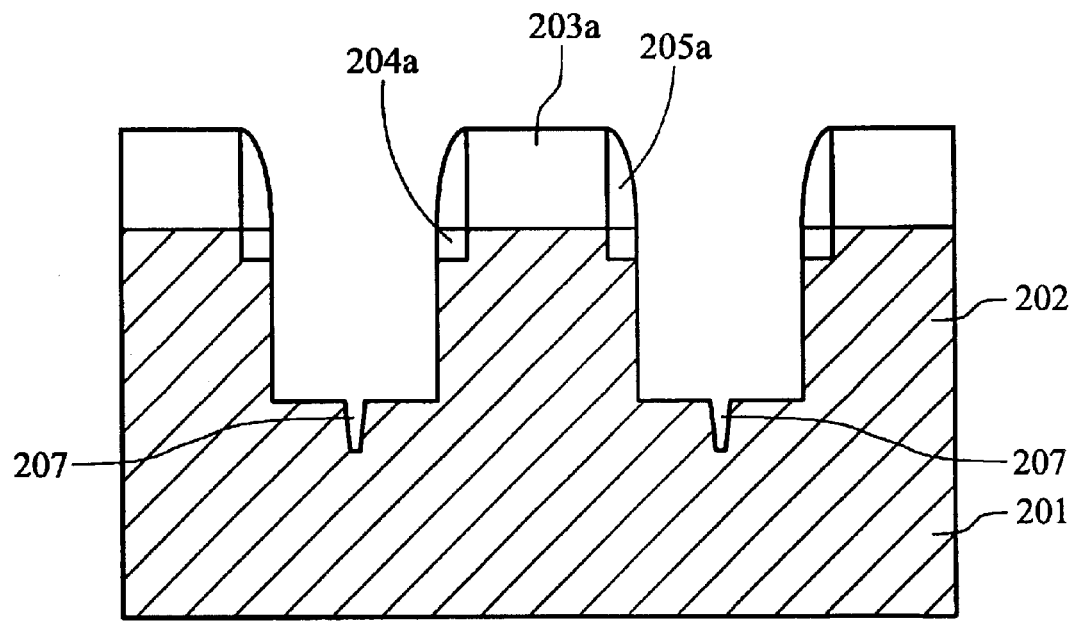
Figure 2K:
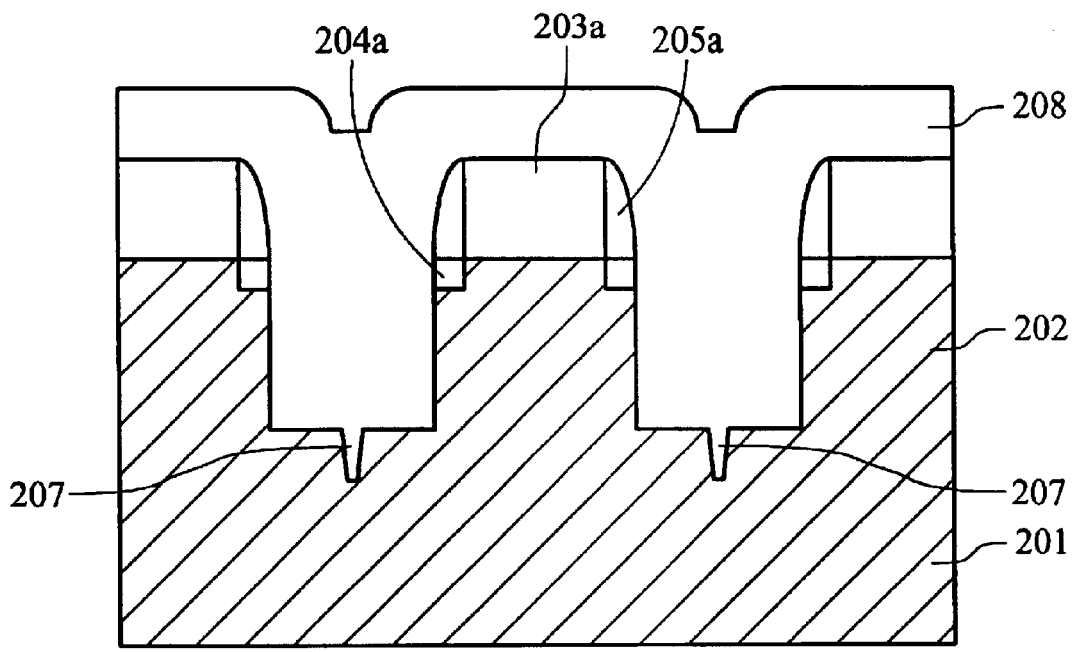
Figure 2L:
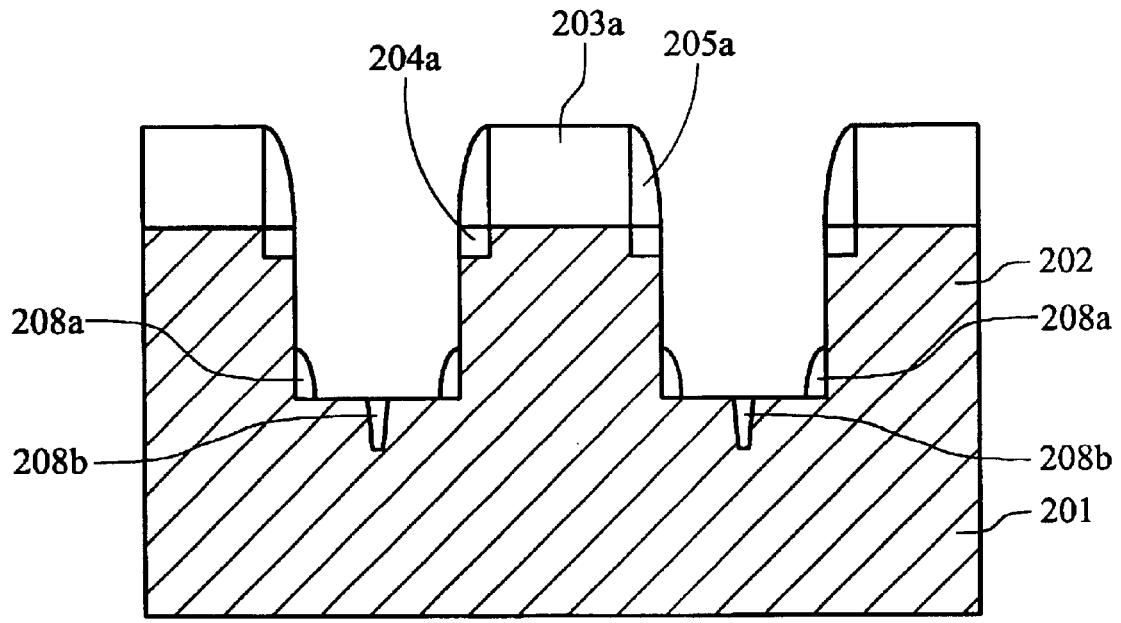
Figure 2M:
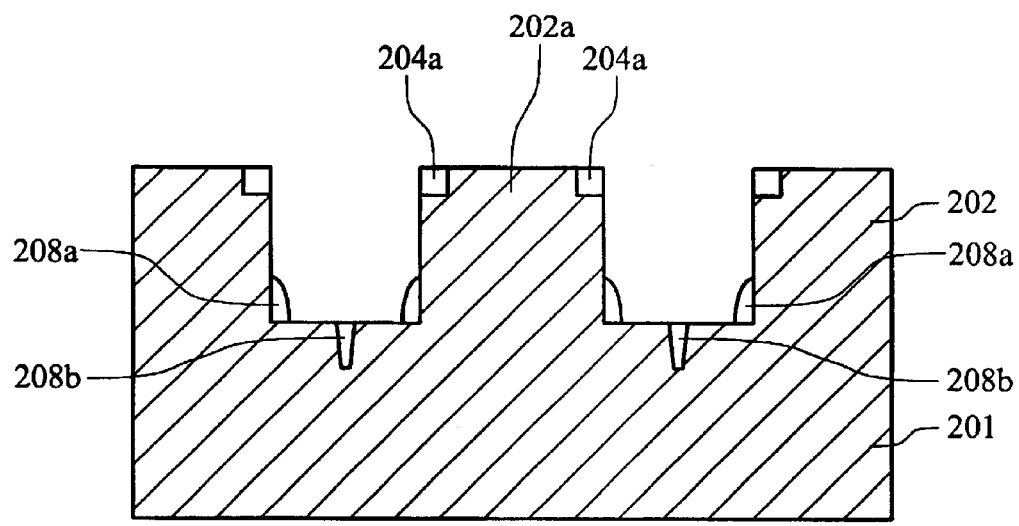
Figure 2N:
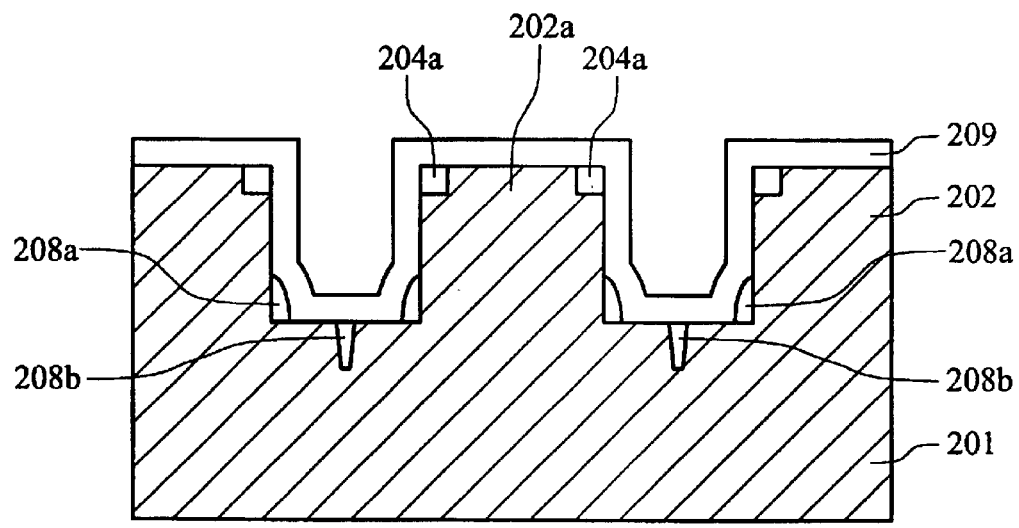

FIGS. 2a–2n are cross-sections of the multi-bit memory unit of the present invention.

In FIG. 2a, a semiconductor substrate 201, such as polysilicon or epitaxial silicon, is provided, and source/drain areas (not shown) are formed thereon. A hard mask layer 203 is formed on the semiconductor substrate 201. The semiconductor substrate 201 is a P-type polysilicon or P-type epitaxial silicon when B ions are implanted into the semiconductor substrate 201. The semiconductor substrate 201 is an N-type polysilicon or N-type epitaxial silicon when As ions or P ions are implanted into the semiconductor substrate 201.

In FIG. 2b, the hard mask layer 203 is photolithographed and etched sequentially to form a hard mask layer 203a. The hard mask layer 203a has an opening, and a portion of the surface of the semiconductor substrate 201 is exposed via the opening. Ions are implanted into the semiconductor substrate 201 to form an ion implantation region 204 using the hard mask layer 203a as a mask, and the ion implantation region 204 is shown as FIG. 2c. The ion implantation region 204 is an As ion implantation region or P ion implantation region when the semiconductor substrate 201 is a P-type polysilicon or P-type epitaxial silicon. The ion implantation region 204 is a B ion implantation region when the semiconductor substrate 201 is an N-type polysilicon or N-type epitaxial silicon.

In FIG. 2d, a first insulation layer 205 is conformally formed on the surface of the semiconductor substrate 201 forming the ion implantation region 204 and the hard mask layer 203a.

In FIG. 2e, the insulation layer 205 is anisotropically etched to form a first spacer 205a on the sidewall of the hard mask layer 203a.

In FIG. 2f, the semiconductor substrate 201 is anisotropically etched to a predetermine depth to form a protruding semiconductor substrate 202 using the hard mask layer 203a and the first spacer 205a as masks. An ion implantation region 204a is formed on a top corner of the protruding semiconductor substrate 202.

In FIG. 2g, a second insulation layer 206 is conformally formed on the surface of the semiconductor substrate 201, the protruding semiconductor substrate 202, the hard mask layer 203a, the ion implantation region 204a, and the first spacer 205a. The material of the second insulation layer 206 is different from the first insulation layer 205, and the etching rate of the second insulation layer 206 is larger than the first insulation layer 205.

In FIG. 2h, the second insulation layer is anisotropically etched to form a second spacer 206a on a sidewall of the first spacer 205a and the protruding semiconductor substrate 202.

In FIG. 2i, the semiconductor substrate 201 is anisotropically etched to form an opening 207 on the semiconductor substrate 201 using the hard mask layer 203a and the second spacer 206a as masks.

In FIG. 2j, the second spacer 206a is removed.

In FIG. 2k, a doped layer 208 is conformally formed on the surface of the semiconductor substrate 201, the protruding semiconductor substrate 202, the hard mask layer 203a, the ion implantation region 204a, the first spacer 205a, and the opening 207. The doped layer 208 covers over the surface of the semiconductor substrate 201 and elements thereon. The opening 207 is filled with the doped layer 208.

The doped layer is an As ion implantation or P ion implantation region when the semiconductor substrate 201 is P-type polysilicon or P-type epitaxial silicon. The doped layer 208 is a B ion implantation region when the semiconductor substrate 201 is N-type polysilicon or N-type epitaxial silicon.

In FIG. 2l, the doped layer 208 is anisotropically etched to form a third spacer on the sidewall of the protruding semiconductor substrate 202, and the doped layer 208 is filled with the opening 207 to form a doped layer 208b.

Dopants for the ion implantation region 204 and the doped layer 208 are not necessarily identical, but doping characteristics of ion implantation region 204 and doped layer 208 are the same. In other words, the ion implantation region 204 and the doped layer 208 are N-type when the semiconductor substrate 201 is P-type, and the ion implantation region 204 and the doped layer 208 are P-type when the semiconductor substrate 201 is N-type In FIG. 2m, the hard mask layer 203a and the first spacer 205a are removed.

In FIG. 2n, an ONO layer 209 is conformally formed on the surface of the semiconductor substrate 201, the doped layer 208b, the protruding semiconductor substrate 202, the ion implantation region 204a, and the third spacer 208a, and thus the multi-bit memory unit is formed.

Figure 3:
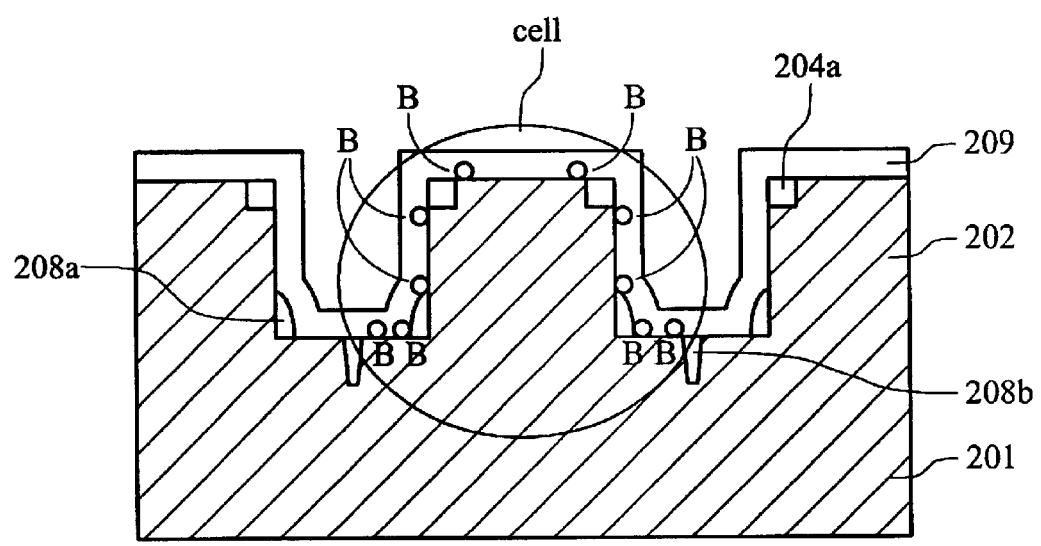
FIG. 3 is a cross-section of the structure of the multi-bit memory unit of the present invention.

FIG. 3 is a cross-section of the structure of the multi-bit memory unit of the present invention.

In FIG. 3, the multi-bit memory unit B is composed of the ONO layer 209, the semiconductor substrate 201, the protruding semiconductor substrate 202, the ion implantation region 204a, the third spacer 208a, and the doped region 208b. The characteristics of ion implantation region 204a, the third spacer 208a, and the doped 208b must be different from the semiconductor substrate 201 and the protruding semiconductor substrate 202. In this case, the multi-bit memory unit B provides 10 bits to store data.

According to the multi-bit memory unit and the fabrication method thereof in the present invention, the number of memory cells is increased by forming a pair of ion-doped areas in the semiconductor substrate, which exhibit different characteristics from the semiconductor substrate.

While the invention has been described by way of example and in terms of the preferred embodiments, it is to be understood that the inventions is not limited to the disclosed embodiments. To the contrary, it is intended to cover various modifications and similar arrangements (as would be apparent to those skilled in the art). Thus, the scope of the appended claims should be accorded the broadest interpretations so as to encompass all such modifications and similar arrangements.

What is claimed is:

1. A method for fabricating a multi-bit memory unit, comprising:

providing a semiconductor substrate with a hard mask layer formed thereon;

implanting ions into the semiconductor substrate to form an ion implantations region using the hard mask layer as a mask;

forming a first spacer on a sidewall of the hard mask layer;

anisotropically etching the semiconductor substrate to form a protruding semiconductor substrate using the hard mask layer and the first spacer as masks;

forming a second spacer on a sidewall of the protruding semiconductor substrate and the first spacer;

anisotropically etching the semiconductor substrate to form an opening using the hard mask layer and the second spacer as masks;

removing the second spacer;

conformally forming a doped layer on the semiconductor substrate;

anisotropically etching the doped layer to form a third spacer on the sidewall of the protruding semiconductor substrate, wherein the opening is filled with the doped layer;

removing the hard mask layer and the first spacer; and conformally forming an ONO layer.

2. The method for fabricating a multi-bit memory unit as claimed in claim 1, wherein the first spacer comprises nitride.

3. The method for fabricating a multi-bit memory unit as claimed in claim 1, wherein the material of the second spacer is different from the material of the first spacer.

4. The method for fabricating a multi-bit memory unit as claimed in claim 1, wherein the semiconductor substrate is polysilicon or epitaxial silicon.

5. The method for fabricating a multi-bit memory unit as claimed in claim 4, wherein the polysilicon is P-type polysilicon or P-type epitaxial silicon.

6. The method for fabricating a multi-bit memory unit as claimed in claim 5, wherein the ion implantations region is an As or P ion implantation region.

7. The method for fabricating a multi-bit memory unit as claimed in claim 5, wherein the doped layer is a doped As or P ions layer.

8. The method for fabricating a multi-bit memory unit as claimed in claim 4, wherein the polysilicon is N-type polysilicon or epitaxial silicon.

9. The method for fabricating a multi-bit memory unit as claimed in claim 8, wherein the ion implantations region is a B ion implantations region.

10. The method for fabricating a multi-bit memory unit as claimed in claim 8, wherein the doped layer is doped B ions layer.

11. A method for fabricating multi-bit memory unit, comprising:

providing a semiconductor substrate, a hard mask layer formed on the semiconductor substrate;

implanting ions into the semiconductor substrate to form an ion implantation region using the hard mask layer as a mask;

conformally forming a first insulation layer on the surface of the semiconductor substrate and the hard mask layer;

anisotropically etching the first insulation layer to form a first spacer on a sidewall of the hard mask layer;

anisotropically etching the semiconductor substrate to form a protruding semiconductor substrate using the hard mask layer and the first spacer as masks;

conformally forming a second insulation layer on the surface of the semiconductor substrate where the hard mask layer, the first spacer, and the protruding semiconductor substrate are formed;

anisotropically etching the second insulation layer to form a second spacer on a sidewall of the semiconductor substrate and the first spacer;

anisotropically etching the semiconductor substrate to form an opening using the hard mask layer and the second spacer as masks;

removing the second spacer;

conformally forming a doped layer on the surface of the semiconductor substrate;

anisotropically etching the doped layer to form a third spacer on a sidewall of the protruding semiconductor substrate, wherein the opening is filled with the doped layer;

removing the hard mask layer and the first spacer; and conformally forming an ONO layer on the surface of the semiconductor substrate.

12. The method for fabricating a multi-bit memory unit as claimed in claim 11, wherein the first spacer comprises nitride.

13. The method for fabricating a multi-bit memory unit as claimed in claim 11, wherein the material of the second spacer is different from the material of the first spacer.

14. The method for fabricating a multi-bit memory unit as claimed in claim 13, wherein the etching rate of the second insulation layer is larger than the etching rate of the first insulation layer.

15. The method for fabricating a multi-bit memory unit as claimed in claim 11, wherein the semiconductor substrate is polysilicon or epitaxial silicon.

16. The method for fabricating a multi-bit memory unit as claimed in claim 15, wherein the polysilicon is P-type polysilicon or epitaxial silicon.

17. The method for fabricating a multi-bit memory unit as claimed in claim 16, wherein the ion implantations region is an As or P ion implantation region.

18. The method for fabricating a multi-bit memory unit as claimed in claim 16, wherein the doped layer is a doped As or P ions layer.

19. The method for fabricating a multi-bit, memory unit as claimed in claim 15, wherein the polysilicon is N-type polysilicon or epitaxial silicon.

20. The method for fabricating a multi-bit memory unit as claimed in claim 19, wherein the ion implantations region is a B ion implantations region.

21. The method for fabricating a multi-bit memory unit as claimed in claim 19, wherein the doped layer is doped B ions layer.

* * * * *